United States Patent [19]
Dent

[11] Patent Number: 5,577,053
[45] Date of Patent: Nov. 19, 1996

[54] METHOD AND APPARATUS FOR DECODER OPTIMIZATION

[75] Inventor: Paul W. Dent, Stehags, Sweden

[73] Assignee: Ericsson Inc., Research Triangle Park, N.C.

[21] Appl. No.: 305,730

[22] Filed: Sep. 14, 1994

[51] Int. Cl.$^6$ .......................... H03M 13/00; H03M 13/12
[52] U.S. Cl. ........................... 371/37.4; 371/37.7; 371/43
[58] Field of Search ............................ 371/43, 37.4, 37.7

[56] References Cited

U.S. PATENT DOCUMENTS

| | | | |
|---|---|---|---|
| 4,108,359 | 8/1978 | Proto | 235/304 |
| 4,134,071 | 1/1979 | Ohnsorge | 325/42 |
| 4,307,463 | 12/1981 | Sibley | 371/14 |
| 4,368,534 | 1/1983 | Sibley | 371/53 |
| 4,497,058 | 1/1985 | Sako et al. | 371/39 |
| 4,949,273 | 8/1990 | Rutherford et al. | 364/480 |
| 5,208,816 | 5/1993 | Seshardi et al. | 371/43 |
| 5,230,003 | 7/1993 | Dent et al. | 371/43 |
| 5,327,439 | 7/1994 | Estola et al. | 371/43 |
| 5,349,589 | 9/1994 | Chennakeshu et al. | 371/43 |
| 5,355,376 | 10/1994 | Cox et al. | 371/43 |

FOREIGN PATENT DOCUMENTS

| | | |
|---|---|---|
| 552781 | 7/1993 | European Pat. Off. . |
| 609934 | 8/1994 | European Pat. Off. . |
| 2033699 | 5/1980 | United Kingdom . |

OTHER PUBLICATIONS

*International Search Report*, Internat'l Appln. No. PCT/US95/11687 Date of Mailing: 22 Feb. 1996.
"The Viterbi Algorithm", G. David Forney, Jr., *Proceedings of the IEEE*, vol. 61, No. 3, pp. 268–278 (Mar. 1973).
"Generalized Viterbi Algorithms for Error Detection with Convolutional Codes", N. Seshadri et al. *Proceedings Of The IEEE*, Globecom. '89, pp. 1534–1538 (Nov. 1989).

*Primary Examiner*—Stephen M. Baker
*Attorney, Agent, or Firm*—Burns, Doane, Swecker & Mathis, L.L.P.

[57] ABSTRACT

In a communications system, a message to be transmitted is used to generate an error detection checkword. Both the message and checkword are encoded into a communication traffic signal using an error correction code. An error correction decoder decodes a received traffic signal, generating a plurality of candidate decoded signals and quantitative measurements of the reliability of the candidates. An error detection calculator tests the most reliable candidate for compliance between its decoded message and checkword. If there is compliance, that candidate and its decoded message are selected. If there is no compliance, the next most reliable candidate is tested for compliance, the selection process continuing until compliance is found. If no compliance is found among all the candidates, an error corrector scrutinizes the most reliable candidate for the presence of a correctable error, and the corrected candidate is re-tested for compliance. If there is still no compliance, the next most reliable candidate is scrutinized for the presence of a correctable error, and the corrected candidate is retested for compliance, the process continuing until compliance is found, up to the limits of the error correction capability of the error corrector.

25 Claims, 10 Drawing Sheets

METHOD AND APPARATUS FOR DECODER OPTIMIZATION

BACKGROUND

The present invention relates to a decoding system for use in signal communications, and in particular, to a decoding system for decoding data messages transmitted using both error detection and error correction coding.

In data transmission over communication channels that are prone to errors, such as radio channels, error detection coding and/or error correction coding may be employed to reduce the errors in the data transmitted. The data transmitted is often digital information, which is easiest to conceptualize in terms of messages composed of binary bits of information, where each bit can be either a ONE or a ZERO. Any given message is then just a string comprising a number of ONES interspersed with a number of ZEROES. It will be appreciated that any string of L bits can represent one of $2^L$ unique messages.

Error detection coding and error correction coding for digital information are distinct types, and both are important. A simple example of error detection coding is adding an identical copy of a message to that message, transmitting both, and performing a bit-by-bit comparison of the received message with the received copy. For each bit position, any disagreement between the message and copy is evidence of a transmission error. The total number of disagreements for a message is a quantitative measure of the reliability of the data transmission. It will be appreciated that the total number of disagreements is an inexact measure of reliability because simultaneous errors at the same bit position in both the message and the copy are not recognized as disagreements.

A common error detection technique, the Cyclic Redundancy Check (CRC) technique, generates and adds to the message "check" bits that are determined based on the bits of the data message. The check bits constitute a "checkword" that is specific to a given message. The checkword may be appended to the message so that both are processed through the same encoder, both are transmitted through the communication channel together, and both are processed through the same decoder in the receiver. A CRC calculator in the receiver may then generate check bits corresponding to the decoded message bits that were received, and this receiver-calculated checkword may be compared with the decoded checkword that was received with the message. Any noncompliance indicates an error detected in transmission, and the degree of compliance may be used as a quantitative measure of the reliability of the data transmission.

By way of contrast, a simple example of error correction coding is transmitting several identical copies of a given message and performing a bit-by-bit comparison of all messages received at the receiver. Whether a bit of the message output from the receiver should be a ONE or a ZERO may be decided on the basis of "bit democracy", i.e., the majority of the bit values received for that bit position determines the output. Transmission errors may be assumed to be randomly distributed among the message copies and will thus be less likely to occur at the same bit position in a majority of the copies.

A known error correction technique is convolutional coding, in which the bits transmitted, known as parity bits, are determined based on the message bits. The message bits are considered L bits at a time, and r parity bits are transmitted for every L message bits. For example, the parity bits may be calculated as certain Boolean combinations of various bits of the message.

The transmission of convolutionally encoded parity bits distinguishes convolutional coding generally from alternative coding schemes such as, for example, block coding, in which a small number of message bits is converted to a redundant block codeword and several such block codewords are transmitted to convey the whole message.

The present invention is described below primarily in the context of convolutional coding, although it may also be applied with other forms of coding as will be mentioned. A general description of known convolutional coding techniques is therefore given below as an aid to understanding the background of the present invention.

Illustrated in FIG. 1 is a transmitter 20 having a convolutional encoder 22 consisting of a shift register 24 through which bits of information to be encoded are shifted. The shift register holds a limited number L of bits, the number L being known as the constraint length of the code because the code is constrained to be considered L bits at a time. At any instant, the bits in the shift register 24, which may be labelled $B_1$, $B_2$, $B_3$, $B_4$, ..., $B_L$, are applied to a combinatorial logic network 26 that generates two or more different Boolean combinations of the bits. As illustrated by FIG. 1, the bits in the shift register 24 may be provided by a CRC error detection generator 28 that receives message information to be transmitted and that generates and adds to the message check bits as described above.

The combinations generated by the network 26 are the parity bits, which are described above and which may be designated $P_1$, $P_2$, ..., $P_r$. The parity bits are transmitted over a communication channel to a receiver 30 having a decoder 32 that converts them back into the data bits $B_1$, $B_2$, $B_3$, ..., $B_L$, and eventually the message information that was transmitted.

An alternative embodiment of the communication system illustrated in FIG. 1 is depicted in FIG. 2. Instead of the combinatorial logic network 26 shown in FIG. 1, the transmitter 20 includes a look-up table 27 comprising $2^L$ entries stored in a conventional memory. The patterns of the L-bit shift register 24 contents $B_1$, $B_2$, ..., $B_L$ address respective entries in the look-up table 27, which produces the characteristic sets of parity bits $P_1$, $P_2$, ..., $P_r$. The Boolean combinations of the patterns of the bits in the shift register 24 are thus stored in the look-up table 27 rather than generated by the logic network 26.

If two parity bits are generated for each shift of the bits through the shift register 24, the code is known as a rate ½ code, with twice as many parity bits as original data bits being transmitted. If the rate of transmission is fixed, the time required to transmit such parity bits is twice as long as the time required to transmit the original data bits. More generally, if r parity bits are generated on every shift, the code is known as a rate 1/r code. Typically, the parity bit transmission rate is adapted to be r times the message information bit rate.

For example, the Boolean combination equations for generating the parity bits of a rate ½ code having a constraint length of five might be:

$P_1 = B_1 + B_2 + B_3 + B_5$ $P_2 = B_1 + B_4 + B_5$ where "+" represents modulo-2 addition. It will be recognized that modulo-2 addition is logically equivalent to the exclusive-OR operation because 0+0=0; 530+1=1+0=1; and 1+1=0.

As noted above, r times more parity bits than input data bits are produced for a rate 1/r code, and, if all parity bits are transmitted, an r-times redundancy has been provided to combat errors. It will, however, be appreciated that it is not necessary to transmit all of the parity bits. If the transmitter and receiver have previously agreed on some regular method of determining which parity bits are not transmitted, the code is then known as a punctured convolutional code. Punctured codes typically result in coding rates m/r, such as 13/29, where adaptation to a transmission rate that is r/m times the message information bit rate is required.

Tables of parity equations for various code rates and constraint lengths that result in optimum codes are published in the technical literature. See, e.g., G. Clarke, Jr., and J. Cain, *Error-Correction Coding for Digital Communications*, Appendix B, Plenum Press, New York (1981).

The principal known methods for decoding convolutional codes are threshold decoding, Sequential Maximum Likelihood Sequence Estimation (SMLSE), and the stack algorithm. The SMLSE technique is commonly known as the Viterbi algorithm, which is described in the literature including D. Forney, "The Viterbi Algorithm", Proc. IEEE, Vol. 61, pp. 268–278 (March, 1973). A description of decoding methods may be found in the Clarke and Cain text cited above.

The operation of an SMLSE convolutional decoding algorithm is illustrated by FIG. 3 for a rate ½ code having a constraint length of five. In the SMLSE decoder, a plurality of electronic storage elements 33, 34, 35 are arranged in groups called states, and the number of states is $2^{L-1}$ where L is the constraint length of the code to be decoded. The storage elements hold at least two different types of information, i.e., bit histories in elements 33 and path metrics in elements 34 associated with the states. In addition, state numbers associated with the states may be stored in elements 34 as binary bit patterns of L-1 bits each.

A path metric may be considered a confidence factor representing the degree of correlation between a postulated bit sequence and an actual (e.g., received) bit sequence. To the extent that the postulated and actual bit sequences agree, the path metric is smaller and the confidence associated with that postulated bit sequence is greater. It will be understood that "postulated bit sequence", or simply "postulate", refers generally to any hypothetical bit sequence having some probability of being the actual bit sequence of interest. A postulate thus can represent message information bits, parity bits, or other codewords.

An important part of most SMLSE decoders is a "copy" 38 of the encoding algorithm. For the example communication system depicted in FIG. 1, the copy 38 could be an L-bit shift register and a combinatorial logic network that implements the equations used in the encoder 22 to generate the parity bits $P_1, P_2, \ldots, P_r$. Alternatively, the copy 38 could be an L-bit shift register and a $2^L$-entry look-up table stored in an electronic memory as in the system shown in FIG. 2. In either case, $2^L$ postulates are generated by the copy 38 and compared directly to the received parity bit stream by a comparator 39.

The (L-1)-bit state numbers in storage elements 34 represent all but one bit of the possible contents of the encoding shift register 24. The L-th bit represents the next bit to be decoded, and can be either ZERO or ONE. Both possibilities are tested in conjunction with all possible combinations of the other bits represented by the state numbers. Thus, all $2^L$ possible bit combinations are tested by the decoder, and a running confidence factor, the path metric 35, is stored for evaluating the correlation between the postulated bit sequence and the received parity bit sequence.

The steps of the SMLSE algorithm are as follows for the rate ½ code having a constraint length of five.

Step 1. For the first state, numbered 0000, it is postulated that the new bit is also a ZERO. The postulate 00000 is thus applied to the copy 38 to obtain the two parity bits $P_1(00000)$ and $P_2(00000)$ that would be expected. In this way, the postulate information is encoded using the same parity equations that were used in the encoder 22 shown in FIGS. 1 and 2.

Step 2. The actual parity bits received $P_1$(actual) and $P_2$(actual) are compared with the postulated parity bits $P_1(00000)$ and $P_2(00000)$ by the comparator 39. The comparison has one of the following results: a match for both bits; a match for one of the two bits and a mismatch for the other of the two bits; or a mismatch for both bits. If both $P_1(00000)$ and $P_2(00000)$ match the actual parity bits received $P_1$(actual) and $P_2$(actual), the value zero is added by an adder 36 to the path metric that is associated with the state 0000 and that may be represented by $G_{pm}(0000)$. Similarly, if there is only a single match, the value one is added to $G_{pm}(0000)$. If neither $P_1(00000)$ nor $P_2(00000)$ match the actual parity bits received $P_1$(actual) and $P_2$(actual), the value two is added to $G_{pm}(0000)$. In this way, the path metric value for any given state represents the cumulative mismatch between the postulated and actual bit sequences for the particular state. The larger the cumulative mismatch for a state, the larger the path metric value and the smaller the running confidence factor for that state.

Step 3. Steps 1 and 2 are repeated for state 1000. With the new fifth bit postulated to be a ZERO, the pattern 10000 is applied to the copy 38, and its output bits $P_1(10000)$ and $P_2(10000)$ are compared to the actual received bits $P_1$(actual) and $P_2$(actual). The path metric for state 1000, designated $G_{pm}(1000)$, is updated as in step 2 based upon comparisons of $P_1$(actual) and $P_2$(actual) with $P_1(10000)$ and $P_2(10000)$.

Step 4. The updated path metrics for states 0000 and 1000, i.e., $G_{pm}(0000)$ and $G_{pm}(1000)$, are compared by a comparator 37. Whichever state has the lower path metric, and hence the lesser mismatch, becomes the new state 0000 when the bit patterns 10000 and 00000 produced by the copy 38 are left-shifted one bit position and the leftmost bit shifts over into the respective bit history in storage elements 33, leaving 0000 in both cases. Thus, either of the states 1000 or 0000 can be the predecessor to the next state 0000 in the case where the new bit is a 0. Depending on which state survives because it has the lowest path metric, the leftmost bit that drops out of the encoder copy 38 pattern to become the rightmost bit of the bit-history 33 for the next state 0000 will be either a 0 or a 1. Moreover, the other corresponding bits in the new bit-history memory 33 are copied over from the surviving selected state, overwriting the bits of the non-survivor, the state that was not selected. For example, as shown in FIG. 3, if the path metric $G_{pm}(1000)$ is 1.8 and the path metric $G_{pm}(0000)$ is 9.5, state 1000 is selected to survive and the left-shifted bits 10110111 are overwritten into the bit-history 33 for the new state 0000.

Step 5. Steps 1–4 are repeated with the postulate that the new bit is a ONE. The postulates 00001 and 10001 for the actual received bits are thus respectively applied to the copy 38 to obtain the pairs of parity bits, $P_1(00001)$, $P_2(00001)$ and $P_1(10001)$, $P_2(10001)$, that would be expected. These parity bit pairs are compared with the actual received parity bits $P_1$(actual) and $P_2$(actual), leading to updated path metrics $G_{pm}(0000)$ and $G_{pm}(1000)$ which are then compared. This results in a new state 0001 which also has possible predecessor states 0000 and 1000.

Step 6. Steps 1–5 are repeated for every other pair of predecessor states: 0001 and 1001 (resulting in new states 0010 and 0011); 0010 and 1010 (resulting in new states 0100 and 0101); 0011 and 1011 (resulting in new states 0110 and 0111); 0100 and 1100 (resulting in new states 1000 and 1001); 0101 and 1101 (resulting in new states 1010 and 1011); 0110 and 1110 (resulting in new states 1100 and 1101); and 0111 and 1111 (resulting in new states 1110 and 1111).

At the end of the above six steps, two actual received parity bits have been processed and one new decoded bit has been shifted into all of the bit history storage elements 33. These memorized patterns are candidates for the final SMLSE sequence. Because of the way bit histories overwrite other bit histories when one of a pair of states is selected to survive, the older bits in the storage elements 33 tend towards agreement. If the oldest bits in all bit histories agree, they may be removed as a final decision and the bit history storage elements 33 shortened by one bit.

The algorithm for other rate codes, such as rate ¼, proceeds similarly although four parity bits would be generated by each postulate and compared with four received bits, generating possible increments to the cumulative path metrics of zero, one, two, three, or four mismatches.

In another variation of the known algorithm, the received parity bits are characterized not just by their bit polarities, but by a magnitude or quality measure representing the degree of "one-ness" or "zero-ness". When a mismatch with a locally predicted postulate parity bit is detected, the path metric is penalized by a greater amount if the received bit quality is high and there is therefore less doubt that its sign was in fact correct, than if the quality is low and the received bit polarity was doubtful. This "soft" decoding as opposed to "hard" decoding ideally uses a "soft" bit quality measure that is related to -LOG(Probability) where "Probability" is the probability that the bit polarity is correct. When this logarithmic measure is used, the cumulative metric then represents minus the logarithm of the product of all the bit probabilities. The state and bit-history sequence then having the smallest cumulative metric represents the sequence having the highest probability of being right. Usually, the noise is assumed Gaussian, in which case the penalty term can be shown to be proportional to the square of the bit amplitude. The penalization for a mismatch between a locally predicted postulate bit and a received high quality bit may be effected by adding a term proportional to 1/(-LOG(Probability)) to the cumulative logarithmic measure when a mismatch is detected. Such an addition can only substantially affect the measure whenever the probability is high that the received bit polarity is correct and yet a mismatch is detected nonetheless.

Such convolutional coders and decoders can also be built to work with non-binary symbols such as ternary or quaternary symbols.

Three areas in which the operation of a convolutional decoder can be improved include truncation of decoded bit sequences, termination of decoding when all received bits have been processed, and determination of the globally second best decoded bit sequence. For example, premature truncation of decoded bit sequences can lead to the loss of information, and known termination of decoding techniques can leave uncorrected message bit errors in the single remaining candidate decoded data message. The present invention solves these vexing problems by avoiding the need to make premature data bit decisions in order to truncate decoded bit sequences, and by terminating decoding while still preserving a plurality of viable candidate decoded data messages.

Known methods for truncation and termination are summarized below for the purpose of providing contrasts with the improvements afforded by the present invention as further described below.

Known Methods For Truncating History Growth

A first known method of truncating the length of bit-history memory needed is to take a decision on the oldest bit once the memory is full. The oldest bit is taken from the history memory associated with the state having the lowest cumulative metric. The oldest bits from the other states are then discarded, shortening the memory by one bit and allowing decoding to proceed one more stage. When all parity bits received have been processed, the result of decoding is a single data sequence corresponding to the bits extracted, followed by $2^{(L-1)}$ candidates for the last part of the message, corresponding to bits still in the history memories.

A second known method of truncation is to form the majority vote across the oldest bits of all states as the decided bit, and then to remove the oldest bits before proceeding.

Both the above known methods lose information by taking a premature decision on the oldest bits.

Known Method for Terminating Decoding

When the last data bit is fed into the encoding shift register, it must be shifted all the way through so that it affects a number of generated parity bits that are transmitted. This requires that further bits, called tail bits, must be fed in behind to flush the last data bit through.

In a known method of termination, the tail bits are a known bit pattern such as all zeros. The prior art decoder method in this case is to constrain the postulates of each new bit corresponding to a tail bit to the known value. Thus after processing the parity bits corresponding to a zero tail bit, only state numbers ending in zero would be produced, halving the number of states. Each successive known tail bit halves the number of states so that finally only one state remains, which is the decoded data message. It is of course possible that this single remaining candidate message contains uncorrected bit errors.

Known Determination of the True Second Best Sequence

The $2^{(L-1)}$ surviving candidate sequences in a normal Viterbi decoder do not necessarily contain the globally second best sequence, although they are guaranteed to contain the globally best sequence. A published modification to a convolutional decoder by N. Seshadri and C. W. Sundberg entitled "Generalized Viterbi Detection with Convolutional Codes", Proc. IEEE Globecom. 89, pp. 1534–1538 (Nov. 1989), allows the globally second best sequence to be calculated as well as the globally best. This requires the number of states to be doubled. Then, for each state, the best and second best path metrics to date are retained. At each iteration, the best of four and the second best of four are chosen to survive to a new state.

The globally third best sequence may also be computed by the above method if three times the number of states are used. In general, the determination of the true globally second and third best sequences by this method is accomplished only at the expense of increased complexity. Generally, the globally Nth best sequence may be computed by the above method if N times the number of states are used. Then, for each state, the N best path metrics to date are retained. At each iteration, the N best out of 2N are chosen to survive to new states.

SUMMARY

A communications system and method is provided to reduce errors in the transmission of a communication traffic signal. A data message to be transmitted is used to generate an error detection checkword. Both the data message and its corresponding error detection checkword are encoded into a communication traffic signal using an error correction code. An error correction decoder decodes a received traffic signal generating a plurality of candidate decoded signals. A quantitative measurement of the reliability of each candidate is generated by the decoder. An error detection calculator tests the most reliable candidate for compliance between its decoded data message and its corresponding decoded error detection checkword. If there is compliance, that candidate and its decoded data message are selected. If there is no compliance, the next most reliable candidate is tested for compliance, the selection process continuing until compliance is found. If no compliance is found among all the candidates, an error corrector scrutinizes the most reliable candidate for the presence of a correctable error, and the corrected candidate is retested for compliance. If there is still no compliance, the next most reliable candidate is scrutinized for the presence of a correctable error, and the corrected candidate is retested for compliance, the process continuing until compliance is found, up to the limits of the error correction capability of the error corrector.

The preferred error correction coding method for data messages for use with the present invention is convolutional coding, as described above. The present invention also employs error detection to check whether decoded data messages contain uncorrected errors. The preferred error detection coding is obtained by appending a cyclic redundancy check (CRC) word to the data message prior to error correction coding, so that the CRC word itself is also protected by the error correction coding.

The present invention utilizes a Viterbi SMLSE decoder modified as described below to decode the error correction coding, yielding a plurality of candidate bit sequences for the data message and its appended CRC word. The candidate bit sequence having the lowest cumulative path metric is then tested for compliance between its data message and CRC bits. If the CRC succeeds, that candidate message is selected for use. If the CRC fails, the candidate bit sequence having the next higher metric is checked, and so on until one of the bit sequences is found to have a compliant CRC, and that candidate message is selected for use.

If none are found to have a compliant CRC, then either the entire message is rejected as erroneous, or other procedures may be defined for selecting one candidate message, based on whether the CRC has the capability also to correct a limited number of errors. For example, the candidate bit sequence with the lowest metric is again checked, and if its CRC syndrome corresponds to a single bit error which can be identified and corrected, then that candidate message is selected for use. If its CRC syndrome does not correspond to a single bit error which can be identified and corrected, then the candidate bit sequence with the next higher metric is again checked. If the candidate bit sequence with the next higher metric has a CRC syndrome corresponding to a single bit error which can be identified and corrected, then that candidate message is selected for use, and so on until one of the candidate bit sequences is found to have a CRC syndrome corresponding to a single bit error which can be identified and corrected, and that candidate message is selected for use.

A decoding system according to the present invention can be used advantageously with a decoding system for distinguishing different types of convolutionally-encoded signals, described in co-pending application No. 07/652,544 filed Feb. 8, 1991, now U.S. Pat. No. 5,230,003, and hereby incorporated by reference.

BRIEF DESCRIPTION OF THE DRAWINGS

The present invention will now be described in more detail with reference to preferred embodiments of the invention, given by way of example, and illustrated in the accompanying drawings, in which.

DETAILED DESCRIPTION

The present invention preferably employs the SMLSE method, as this method provides theoretically optimum performance. The other methods tend to be a compromise between performance and complexity, especially for long constraint length codes, as the complexity of SMLSE rises exponentially with increasing constraint length. Thus, while the present invention may be applied to any decoding method, such as the majority vote method, an implementation of a preferred embodiment of the present invention will be described in the context of the SMLSE method. However, this implementation is for the purposes of description only.

The present invention uses, in preferred embodiments, a preferred method of bit-history truncation, and one of the preferred methods of terminating decoding.

Method of Bit-History Truncation

Figure 4:
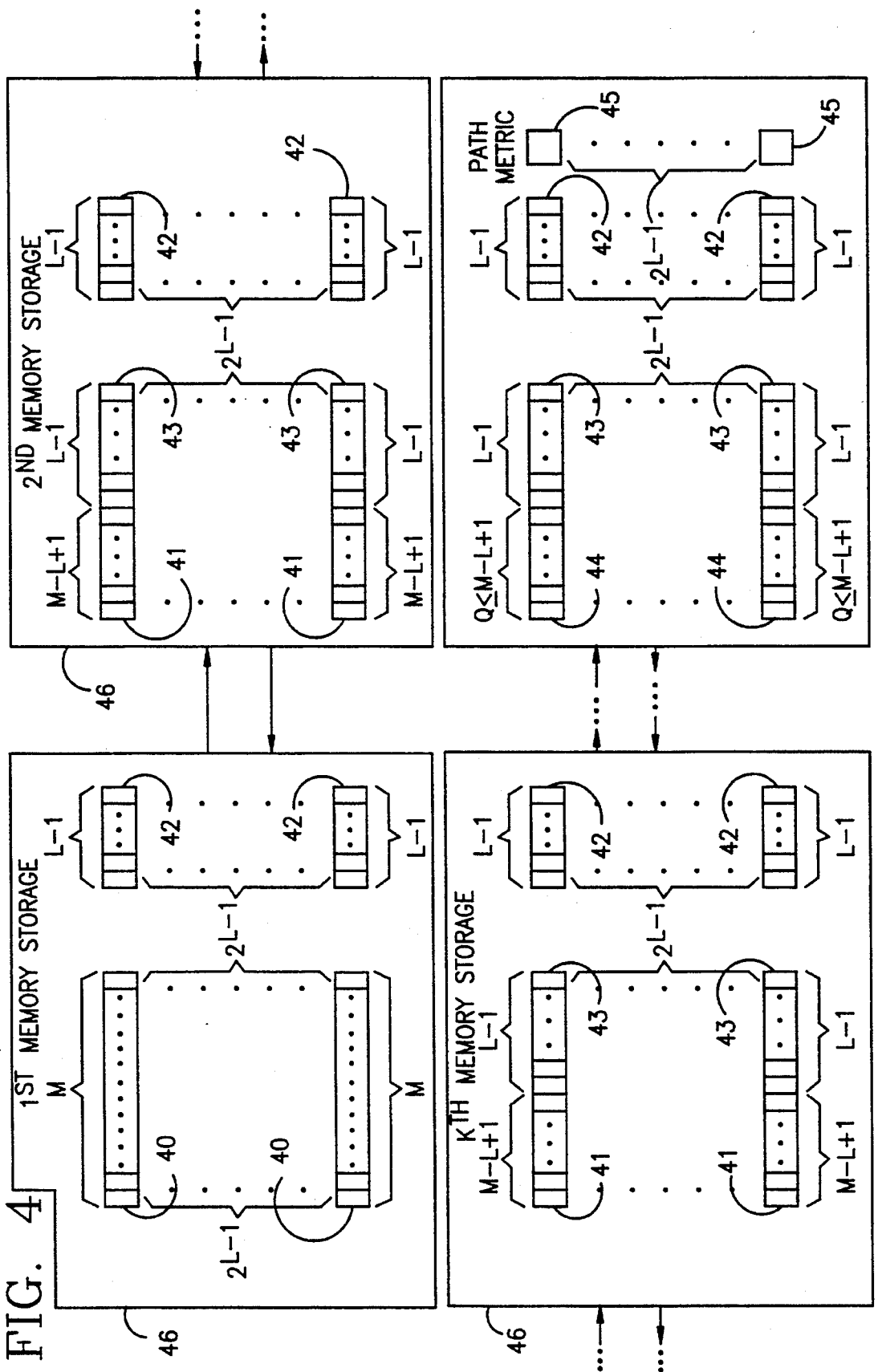
FIG. 4 illustrates a memory storage system for a truncation technique which may be used in the present invention.

The present invention avoids taking premature data bit decisions in order to truncate bit-histories. The principal reason for normally employing truncation is to avoid the inconvenience of copying ever longer bit sequences from one state to another when one of a pair of predecessor states is selected to survive. It is more convenient if the amount of bit-history held is commensurate with the fixed word length of a digital signal processing machine, such as 16 or 32 bits. The preferred method, which can be implemented with a memory storage system illustrated schematically in FIG. 4, provides the convenience of fixed history lengths for copying between states without needing to take hard decisions on the oldest bit.

When the bit-history has grown to equal the maximum convenient word length M, all $2^{(L-1)}$ bit-histories are dumped to a first storage memory 46, as indicated by 40, from which they may be accessed by an (L-1)-bit address 42. The (L-1)-bit address 42 corresponding to the associated bit-history 40 is then placed in each state in place of the original M bits, as indicated by 43. It is understood that L-1 is assumed to be less than M, so that M-L+1 bit positions of each word have been made available for further decoding. The decoding algorithm may then be executed a further M-L+1 times until each bit-history word is again full, and the contents once more dumped, this time to a second memory storage 46, as indicated by 41, replacing the M bits in each history with their (L-1)-bit addresses 42 in the second memory storage 46. This process is repeated until all bits have been processed. Thus, in the Kth memory storage 46, $2^{(L-1)}$ bit-history words of length M are labelled by their respective (L-1)-bit addresses 42. Each of the M-bit words contains M-L+1 decoded bits 41, and the (L-1)-bit address 43 corresponding to the (L-1)-bit address 42 in the (K-1)st memory storage 46 where the immediately preceding decoded bits 41 are located. After all the bits have been processed, the decoder memory 48 contains $2^{(L-1)}$ bit-history words of length M at most, labelled by their respective (L-1)-bit addresses 42. Each of the bit-history words contains the last Q decoded bits 44, where Q is less than or equal to M-L+1, and the (L-1)-bit address 43 corresponding to the (L-1)-bit address 42 in the last memory storage 46 where the immediately preceding decoded bits 41 are located. The decoder memory 48 also contains cumulative path metrics 45 associated with each of the respective $2^{(L-1)}$ candidates for the entire message.

Each of the $2^{(L-1)}$ candidates for the entire message existing at the end of processing may be constructed by chaining together the contents of the external memory storages 46 using the address bits 43 as chainpointers. To construct the candidate for the data message from final state 0, the steps are as follows:

1) Extract the Q decoded data bits 44 from the M-bit bit-history for final state 0 in the decoder memory 48 as the last decoded data bits.

2) Extract the (L-1) address bits 43 from the M-bit bit-history for final state 0 and retrieve the M-bit word from the external memory storage 46 corresponding to that extracted (L-1)-bit address 43.

3) Extract the M-L+1 decoded data bits 41 from the retrieved word and append to the Q decoded data bits 44 extracted from the decoder memory 48.

4) Extract the L-1 address bits 43 from the retrieved word and use them to address the previously used external memory storage 46, retrieving the previous M-bit word corresponding to the (L-1)-bit address 43.

5) Extract the M-L+1 decoded data bits 41 from the retrieved word and append to the already extracted concatenated decoded data bits.

6) Repeat steps 4)–5) until the end of the chain is reached.

The concatenated data bits extracted then form the decoded message candidate belonging to final state 0. The candidates belonging to other final states may be constructed likewise, by starting with the appropriate state and chaining back.

Figure 5:
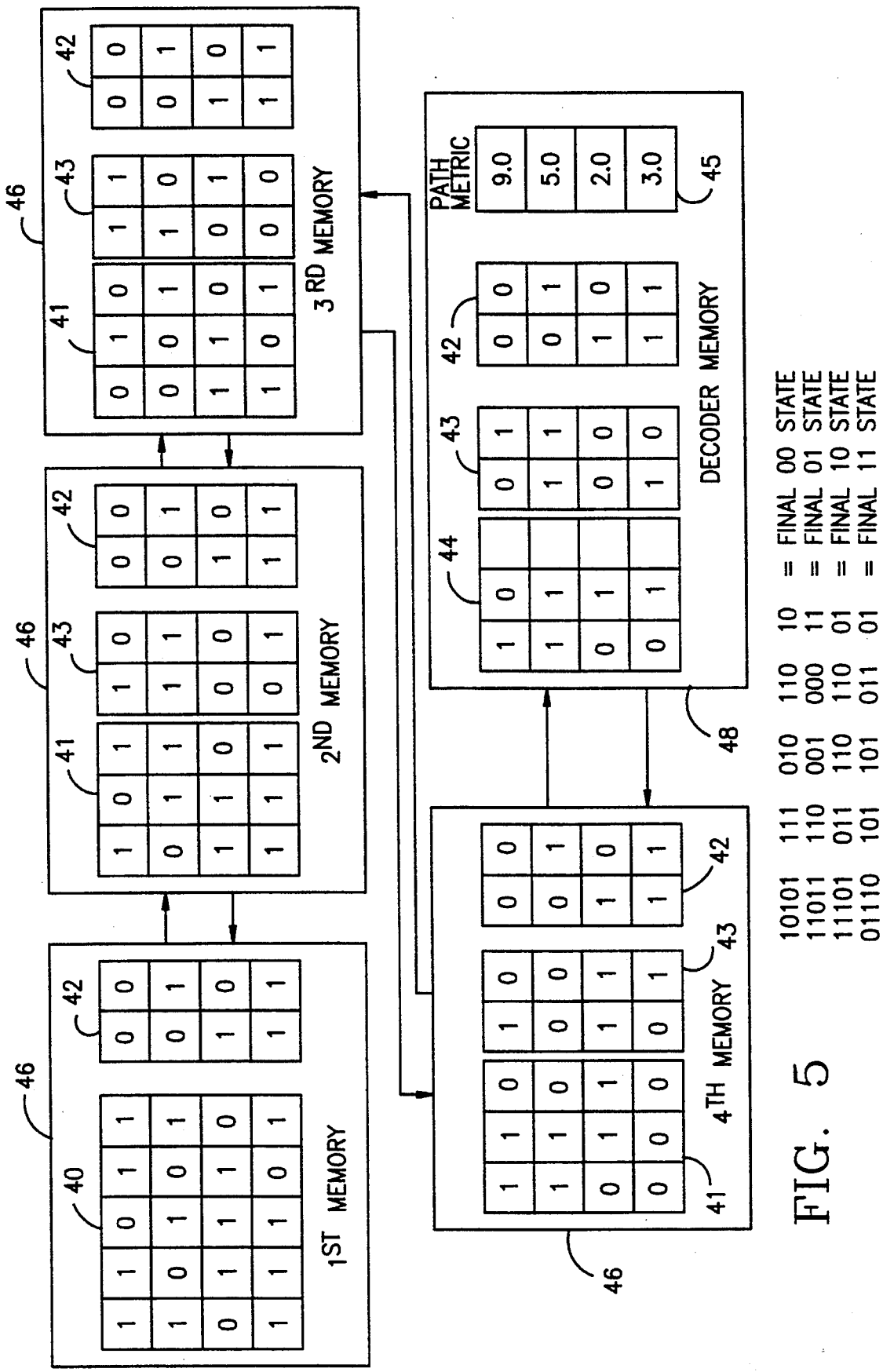
FIG. 5 illustrates an example of a truncation technique which may be in the present invention.

In conjunction with FIG. 5, an example of the concatenation operation will be described assuming a constraint length L=3. The final state in the decoder memory 48 with the lowest cumulative path metric 45 is final state 10 ($G_{pm}(10)$= 2.0), whose last decoded data bits 44 are 01 (Q=2). The extracted 2-bit address 43 is 00, and the 3 decoded data bits 41 extracted from the corresponding 00 address 42 in the 4th memory 46 are 110, which are appended to 01, the last decoded data bits 44, yielding 110-01. The next extracted 2-bit address 43 is 10, and the next 3 decoded data bits 41 extracted from the corresponding 10 address 42 in the 3rd memory 46 are 110, which when appended to the growing chain yields 110-110-01. The next extracted 2-bit address 43 is 01, and the next 3 decoded data bits 41 extracted from the corresponding 01 address 42 in the 2nd memory 46 are 011, which when appended to the growing chain yields 011-110-110-01. The last extracted 2-bit address 43 is 11, and the remaining 5 decoded data bits 40 extracted from the corresponding 11 address 42 in the 1st memory 46 are 11101, which when appended to the growing chain yields finally 11101-011-110-110-01, the decoded message candidate belonging to final state 10. The candidates belonging to other final states may be constructed likewise, by starting with the appropriate state and chaining back, with the results as given in FIG. 5.

Preferred Methods for Terminating Decoding

The preferred methods for terminating decoding preserve a plurality of candidates, for example $2^{(L-1)}$.

Figure 6:
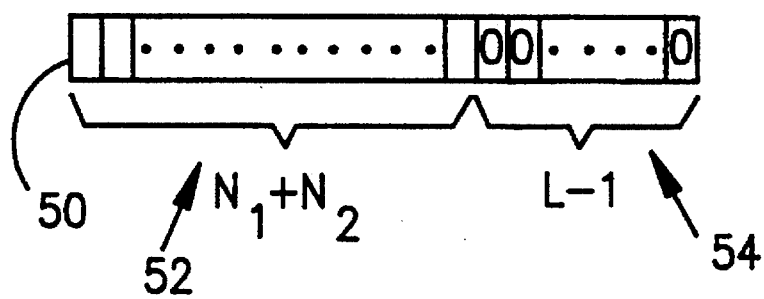
FIGS. 6, 6a and 6b illustrate examples of bit sequences for decoding termination strategies which may be used in the present invention.

One preferred method utilizes tail bits, but does not contract the number of states at the end. The known tail bits are used in the decoder to predict, for each state, what parity bits should be received, and the state metrics are simply updated with no overwriting. Then $2^{(L-1)}$ candidate data sequences thus remain at the end. The known tail bits can be, as in the example of bit sequence 50 shown in FIG. 6, a sequence of L-1 zeros 54 appended to the sequence of $N_{11}+N_2$ bits 52 (comprising $N_1$ message data bits and $N_2$ error check bits).

Figure 1:
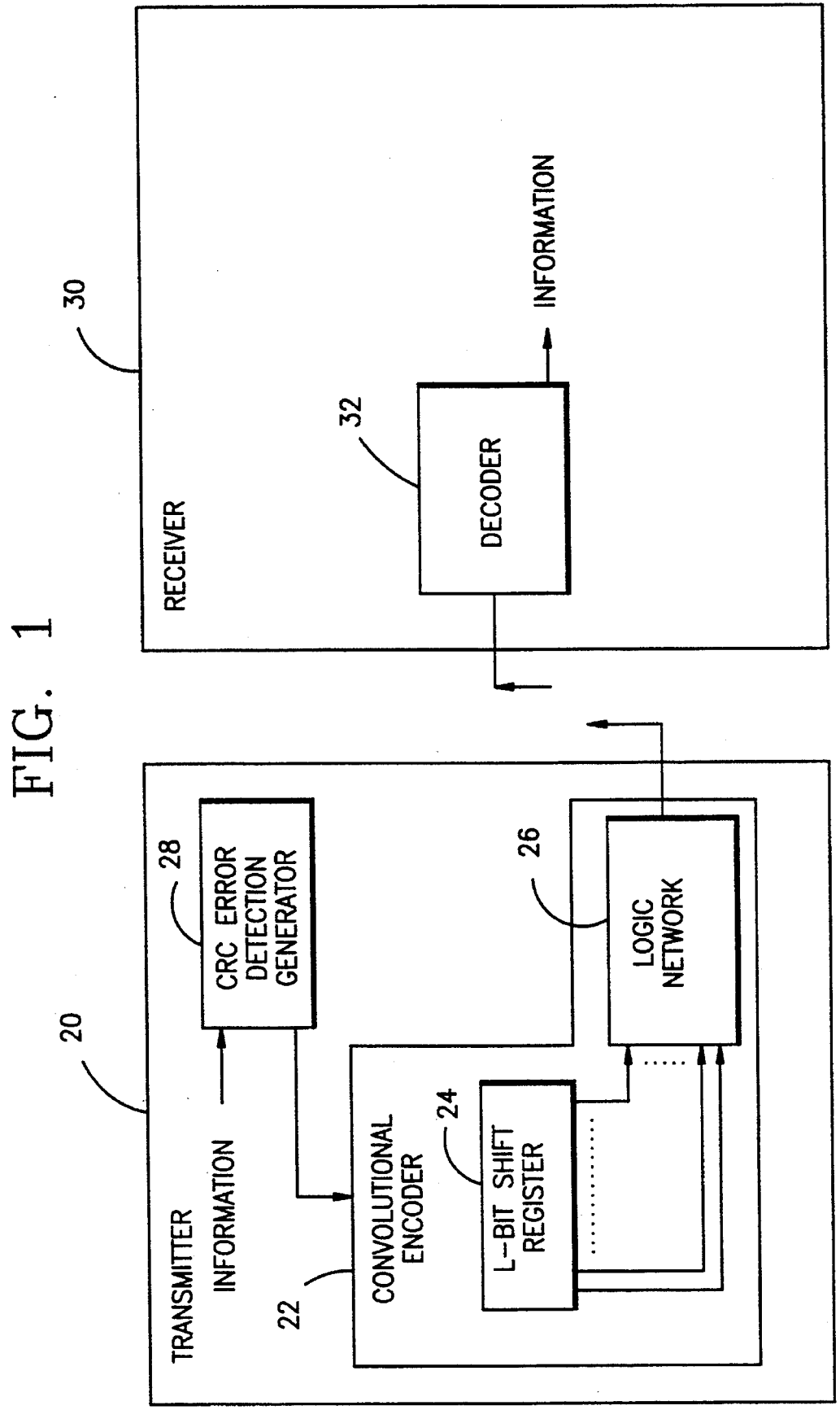
FIG. 1 illustrates a communications system incorporating a convolutional encoder which may be used in the parent invention.
Figure 2:
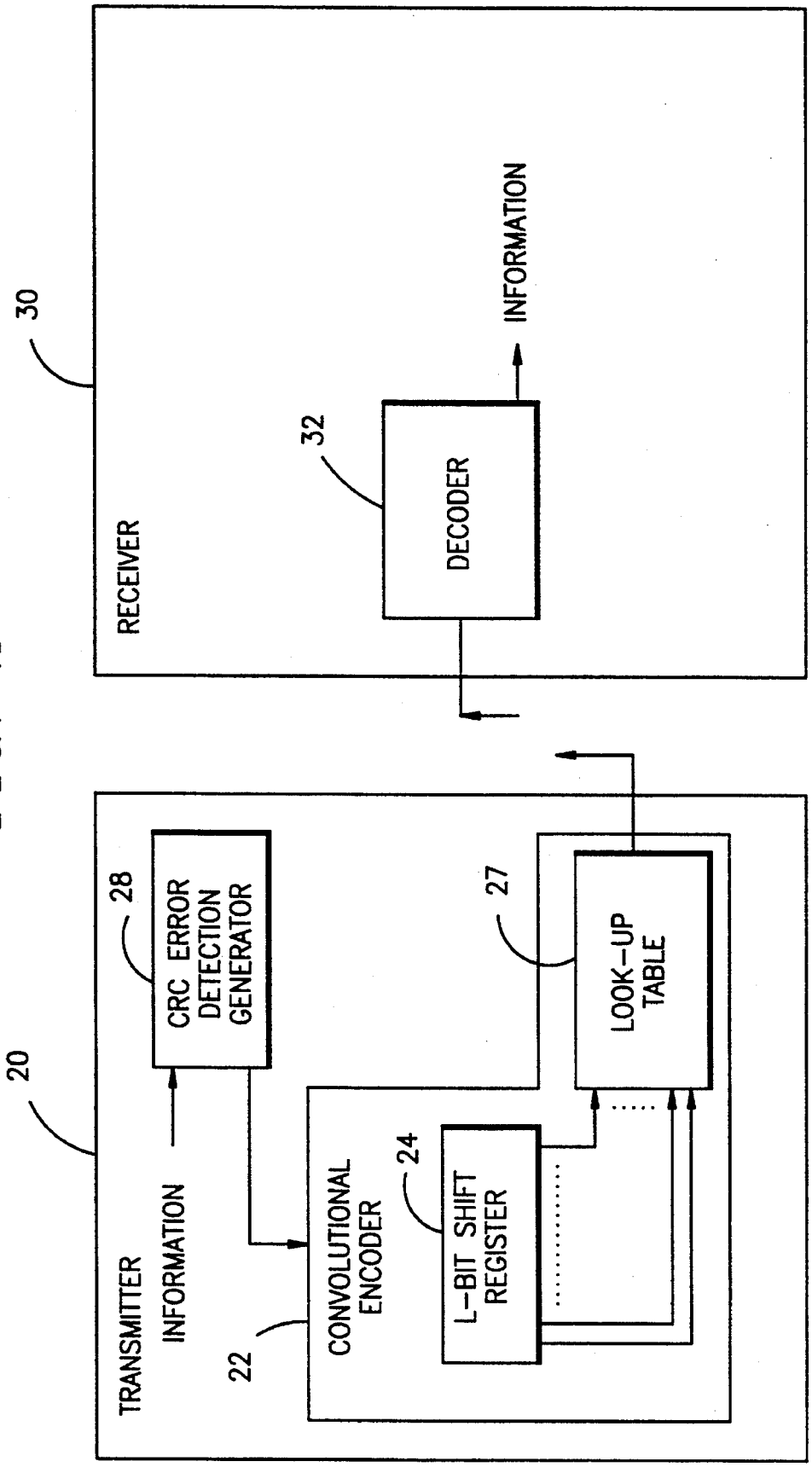
FIG. 2 illustrates a communications system incorporating alternative convolutional encoder to that shown FIG. 1 which may also be used in the present invention.
Figure 3:
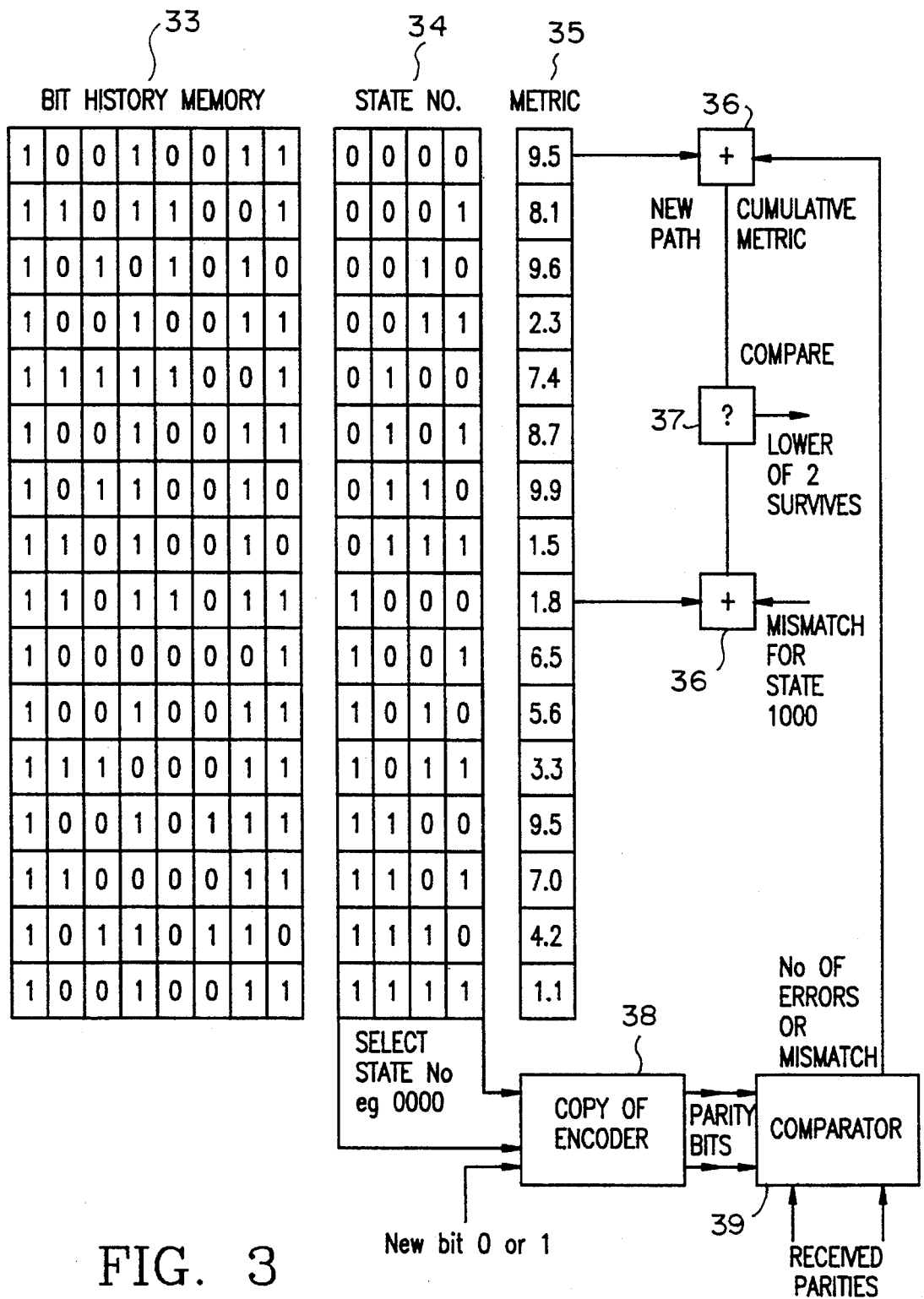
FIG. 3 illustrates an example of a convolutional decoding algorithm which may be used in the present invention.

In conjunction with FIG. 3, an example of the preferred method of termination of decoding using tail bits known beforehand to the decoder 32 in FIGS. 1 and 2 will be described assuming a constraint length L=5, rate 1/r=½ code. Assuming the last of the bits entered into the 5-bit shift register in the encoder copy is the first of the known 4-bit tail bit zeros 54, the steps for decoding termination are as follows:

1) For the first state, numbered 0000, it is "postulated" that the new bit is also a 0. The postulate 00000 for the information bits received is thus applied to a copy 38 of the encoder 22 to obtain the two parity bits $P_1(00000)$ and $P_2(00000)$ that would be expected.

2) The actual parity bits received $P_1$(actual) and $P_2$(actual) are compared with the postulate parity bits $P_1(00000)$ and $P_2(00000)$. The comparison results either in a complete match for both bits, or a single match for one of the two bits and a single mismatch for the other one of the two bits, or a complete mismatch for both bits. If both $P_1(00000)$ and $P_2(00000)$ match the actual parity bits received $P_1$(actual) and $P_2$(actual), the number 0 is added to the path metric associated with the state 0000, $G_{pm}(0000)$. Similarly, if there is only a single match, the number 1 is added to the 0000 path metric $G_{pm}(0000)$. If neither $P_1(00000)$ nor $P_2(00000)$ match the actual parity bits received $P_1$(actual) and $P_2$(actual), the number 2 is added to the 0000 path metric $G_{pm}(0000)$. The new bit-history 33 for state 0000 is then 00100110, whose rightmost bit corresponds to the leftmost bit of the 5-bit encoder copy 38 pattern 00000.

3) Steps 1) and 2) are now repeated for state 1000. With the new 5th bit "postulated" to be a 0, the pattern 10000 is applied to the encoder copy 38 and its output $P_1(10000)$ and $P_2(10000)$ compared to the received data $P_1$(actual) and $P_2$(actual). The path metric for state 1000, $G_{pm}(1000)$, is then updated as in step 2), based upon comparisons of the actual parity bits received $P_1$(actual) and $P_2$(actual) with the postulate parity bits $P_1(10000)$ and $P_2(10000)$. The new bit-history 33 for state 1000 is then 10110111, whose rightmost bit corresponds to the leftmost bit of the 5-bit encoder copy 38 pattern 10000.

4) Steps 1)–3) are repeated for every other pair of predecessors states 0001 and 1001, 0010 and 1010, 0011 and 1011, 0100 and 1100, 0101 and 1101, 0110 and 1110, and 0111 and 1111.

At the end of one of the above iterations, two received parity bits have been processed and one new decoded bit has been shifted into all the bit-history memories 33. Steps 1)–4) are then repeated 3 more times for the 3 remaining tail bit zeros 54.

Figure 6A:
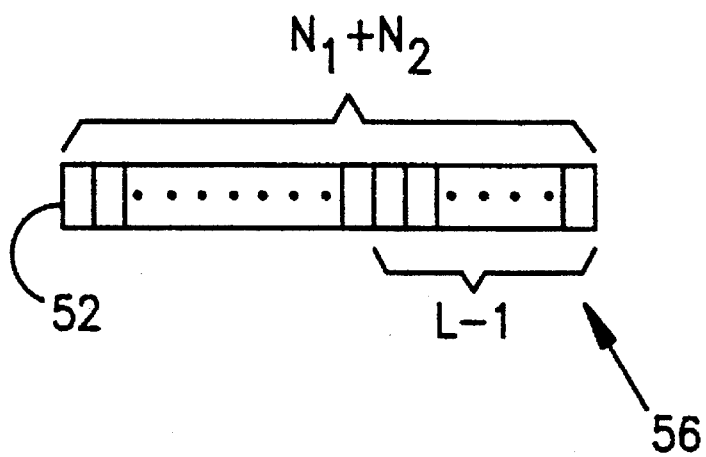

A second preferred method of termination uses what is known as tail-biting. In this method, the encoder uses the first-encoded data bits again to flush through the last data bit. The decoder correspondingly uses the first decoded bits from each candidate data message in conjunction with postulates of the last data bit to predict received parity bits and updates the metrics accordingly with no overwriting, thus preserving all $2^{(L-1)}$ candidates at the end. Shown in FIG. 6a is an example of a bit sequence 52 that can be used with tail-biting termination. The bit sequence 52 comprises $N_{11}+N_2$ bits, with the first L-1 bits 56 serving as "tail bits" that are unknown beforehand by the decoder 32 in FIGS. 1 and 2, and that are used to flush the last bit of the bit sequence 52 to be encoded through the L-bit shift register 24 in the transmitter 20 encoder 22.

In conjunction with FIG. 3, an example of a preferred method of termination of decoding using tail-biting will be described assuming a constraint length L=5, rate 1/r=½ code. Assume the last of the bits entered into the 5-bit shift register in the encoder copy is the first of the unknown 4-bit "tail bits" 56, in other words, the first bit to have been decoded. Assume further that the first bit to have been decoded happened to have been a 1. The steps for decoding termination are as follows:

1) For the first state, numbered 0000, it is "postulated" that the new bit is a 1. The postulate 00001 for the information bits received is thus applied to a copy 38 of the encoder 22 to obtain the two parity bits $P_1(00001)$ and $P_2(00001)$ that would be expected.

2) The actual parity bits received $P_1$(actual) and $P_2$(actual) are compared with the postulate parity bits $P_1(00001)$ and $P_2(00001)$. The comparison results either in a complete match for both bits, or a single match for one of the two bits and a single mismatch for the other one of the two bits, or a complete mismatch for both bits. If both $P_1(00001)$ and $P_2(00001)$ match the actual parity bits received $P_1$(actual) and $P_2$(actual), the number 0 is added to the path metric associated with the state 0000, $G_{pm}(0000)$. Similarly, if there is only a single match, the number 1 is added to the 0000 path metric $G_{pm}(0000)$. If neither $P_1(00001)$ nor $P_2(00001)$ match the actual parity bits received $P_1$(actual) and $P_2$(actual), the number 2 is added to the 0000 path metric $G_{pm}(0000)$. The new bit-history 33 for state 0000 is then 00100110, whose rightmost bit corresponds to the leftmost bit of the 5-bit encoder copy 38 pattern 00001.

3) Steps 1) and 2) are now repeated for state 1000. With the new 5th bit "postulated" to be a 1, the pattern 10001 is applied to the encoder copy 38 and its output $P_1(10001)$ and $P_2(10001)$ compared to the received data $P_1$(actual) and $P_2$(actual). The path metric for state 1000, $G_{pm}(1000)$, is then updated as in step 2), based upon comparisons of the actual parity bits received $P_1$(actual) and $P_2$(actual) with the postulate parity bits $P_1(10001)$ and $P_2(10001)$. The new bit-history 33 for state 1000 is then 10110111, whose rightmost bit corresponds to the leftmost bit of the 5-bit encoder copy 38 pattern 10001.

4) Steps 1)–3) are repeated for every other pair of predecessors states 0001 and 1001, 0010 and 1010, 0011 and 1011, 0100 and 1100, 0101 and 1101, 0110 and 1110, and 0111 and 1111.

At the end of one of the above iterations, two received parity bits have been processed and one new decoded bit has been shifted into all the bit-history memories 33. Steps 1)–4) are then repeated 3 more times for the 3 remaining "tail bits" 56, "postulating" in each case that the new 5th bit is whatever the corresponding already received bit was. For example, if the 2nd, 3rd, and 4th decoded bits are assumed to have been 0, 1, and 1, respectively, then on the 2nd repetition of steps 1)–4), the new bit is "postulated" to be a 0, on the 3rd repetition, the new bit is "postulated" to be a 1, and on the 4th repetition, the new bit is "postulated" to be a 1.

Figure 6B:
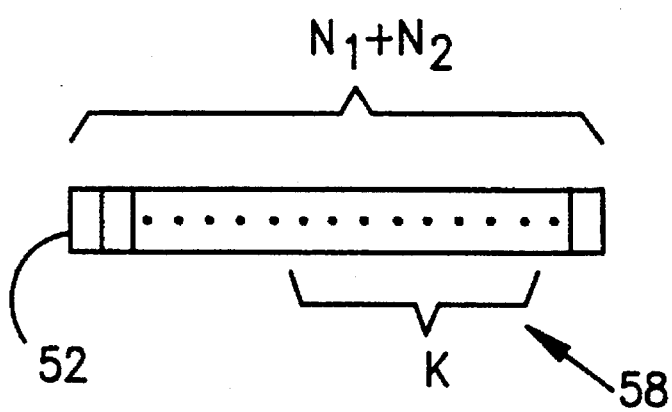

An alternative termination for a tail-biting decoder is to continue decoding in a circle until a number of last decoded bits agree with the same bits when decoded the first time, either in the state having the lowest metric, a number Z of states having the Z lowest metrics, or indeed in all states, depending on how many candidate sequences are required out of the decoder. An example is shown in FIG. 6b where K bits 58 within the $(N_1+N_2)$-bit sequence 52 represent a number of bits that agree when decoded twice during the continuous decoding of bit sequence 52, whereupon decoding is terminated. To be effective in flushing the last data bit through the L-bit shift register 24 in the transmitter 20 encoder 22, either the number K must be at least as large as L-1, or, if K is less than L-1, the K-bit sequence 58 must be appropriately positioned within the bit sequence 52. For example, if K is less than L-1, the rightmost of the K bits 58 must be positioned at least L-K-2 bits to the left of the rightmost bit in the bit sequence 52.

A known method of choosing the final data message from these candidates is simply to pick the state having the lowest cumulative metric.

Implementations of Preferred Embodiments

Block diagrams of the preferred arrangements for implementing the invention are shown in FIGS. 1, 2, 7, 8, 9, and 10.

Figure 7:
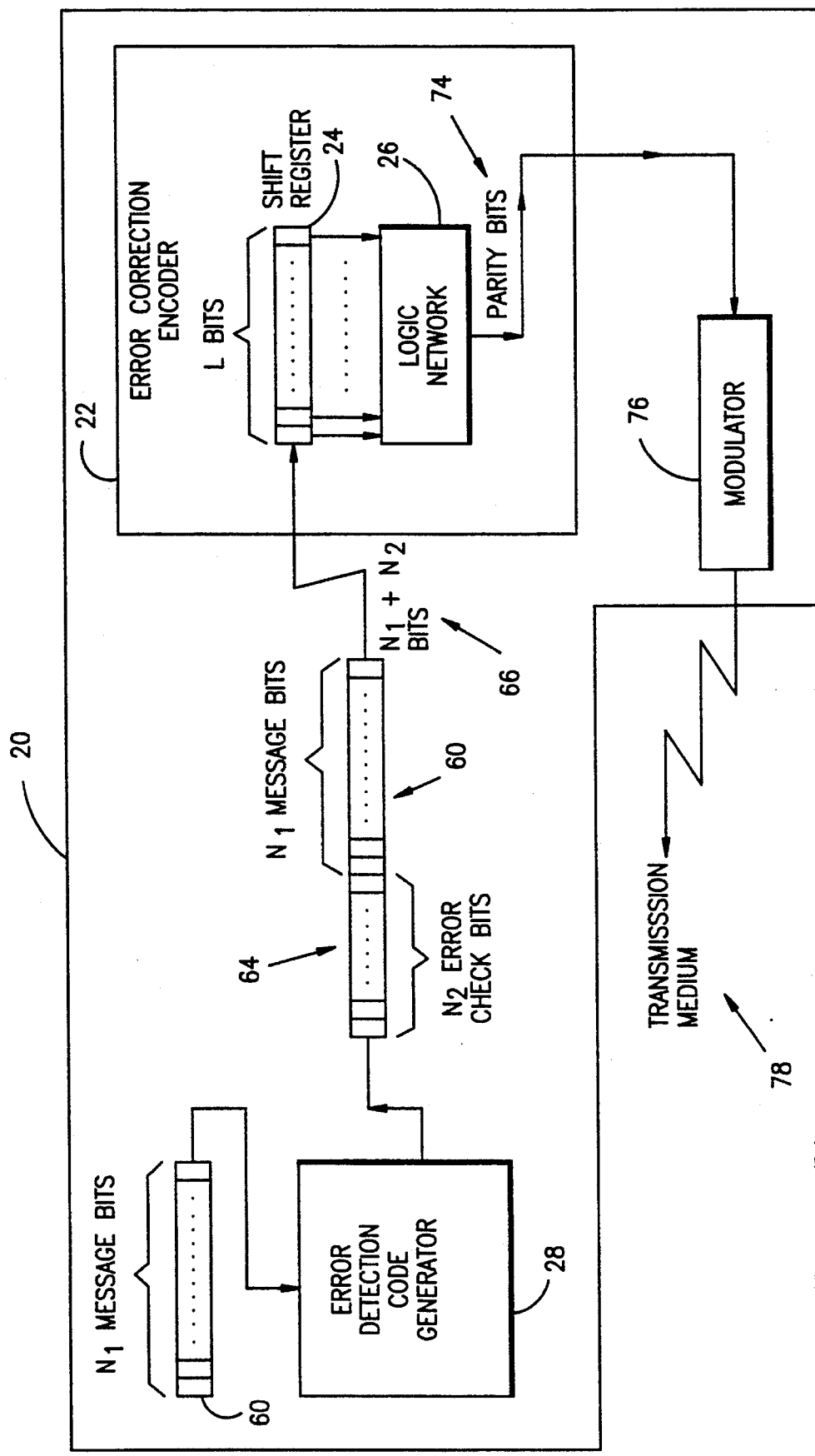
FIG. 7 shows a functional block diagram of an encoder for implementing an embodiment of the present invention.
Figure 8:
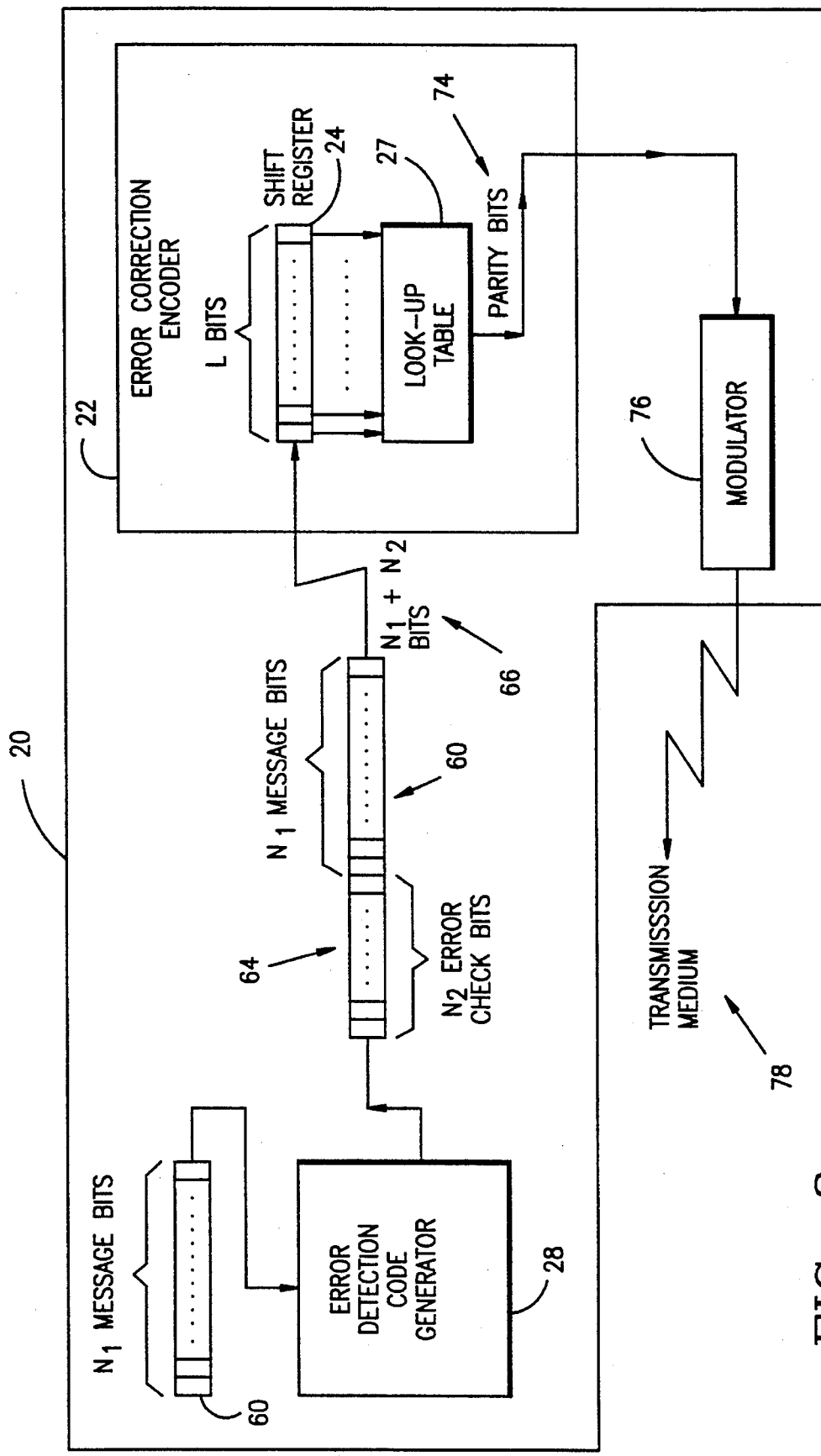
FIG. 8 shows a functional block diagram of an encoder for implementing another embodiment of the present invention.

Referring to FIGS. 7 and 8, a data message 60, consisting of $N_1$ message bits to be transmitted from transmitter 20, is input to an error detection code generator 28 which forms a cyclic redundancy check (CRC) by calculating the remainder upon polynomial division of the data message 60 by the chosen CRC polynomial (not shown). For example, the simplest possible polynomial is 1, and the remainder upon division of any data bit sequence by 1 is just that data bit sequence again, generating a simple redundancy. More sophisticated polynomials generate more complicated remainders, generally, as is well known. See, for example, Line and Costello "Error Control Coding", Prentice-Hall (1983), Chapter 4.5 (ISBN 0-13-283796-X), which disclosure is incorporated here by reference. The CRC remainder 64, consisting of $N_2$ error check bits, is then appended to the $N_1$ message bits 60 making a total of $N_1+N_2$ bits 66 that are then input to the convolutional error correction encoder 22. Depending on whether the tail-biting method described above is used or not, a further L-1 zeros may be appended where L is the constraint length of the convolutional code, making $L-1+N_1+N_2$ bits in total. If tail-biting is used, the first L of the $N_1+N_2$ bits 66 are loaded into the encoding shift register 24, while if tail-biting is not used, the L-1 zeros plus the first of the $N_1$ data message bits 60 are loaded into the encoding shift register 24.

Taps on the shift register 24 are connected to the inputs of a combinatorial logic network 26 that forms the parity bits 74 to be transmitted. An alternative, shown in FIG. 8, is to use the L bits in the shift register to address a $2^L$ element look-up table 27 in electronic memory, wherein the appropriate parity bit combination for each possible shift register bit pattern is stored. In either case, a number of parity bits 74, proportional to the reciprocal of the code rate 1/r, are produced for each shift of the shift register 24. After the last of the $N_2$ CRC bits 64 has been fed in, it is flushed through by repeating the first bits encoded, which, in the case of tail-biting, means feeding in the first L-1 of the $N_1+N_2$ bits 66 again, or without tail-biting, the L-1 initial zeros are fed in again. It may be realized that, if the array of $N_1+N_2$ bits 66 or $L-1+N_1+N_2$ bits is regarded as forming a circle, then there is no difference in principle in the function of the encoder 22 in either case.

The number of parity bits 74 to be transmitted from transmitter 20 is either $(N_1+N_2)r$ or $(L-1+N_1+N_2)r$, and these are fed sequentially to a modulator 76 for conversion to a form suitable for passing through the communications transmission medium 78, for example, a radio channel.

Figure 9:
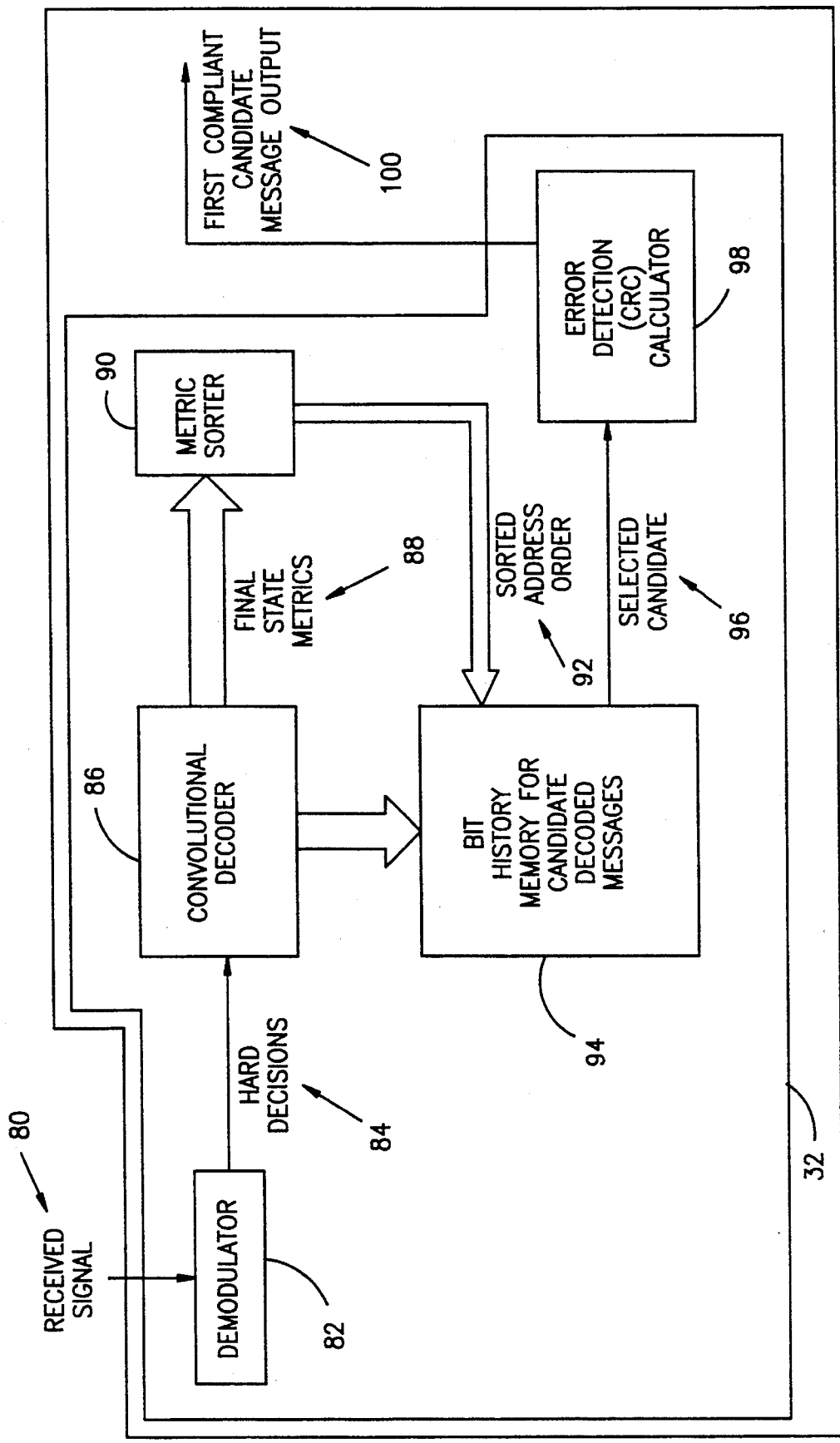
FIG. 9 shows a functional block diagram of a decoder according an embodiment of the present invention.
Figure 10:
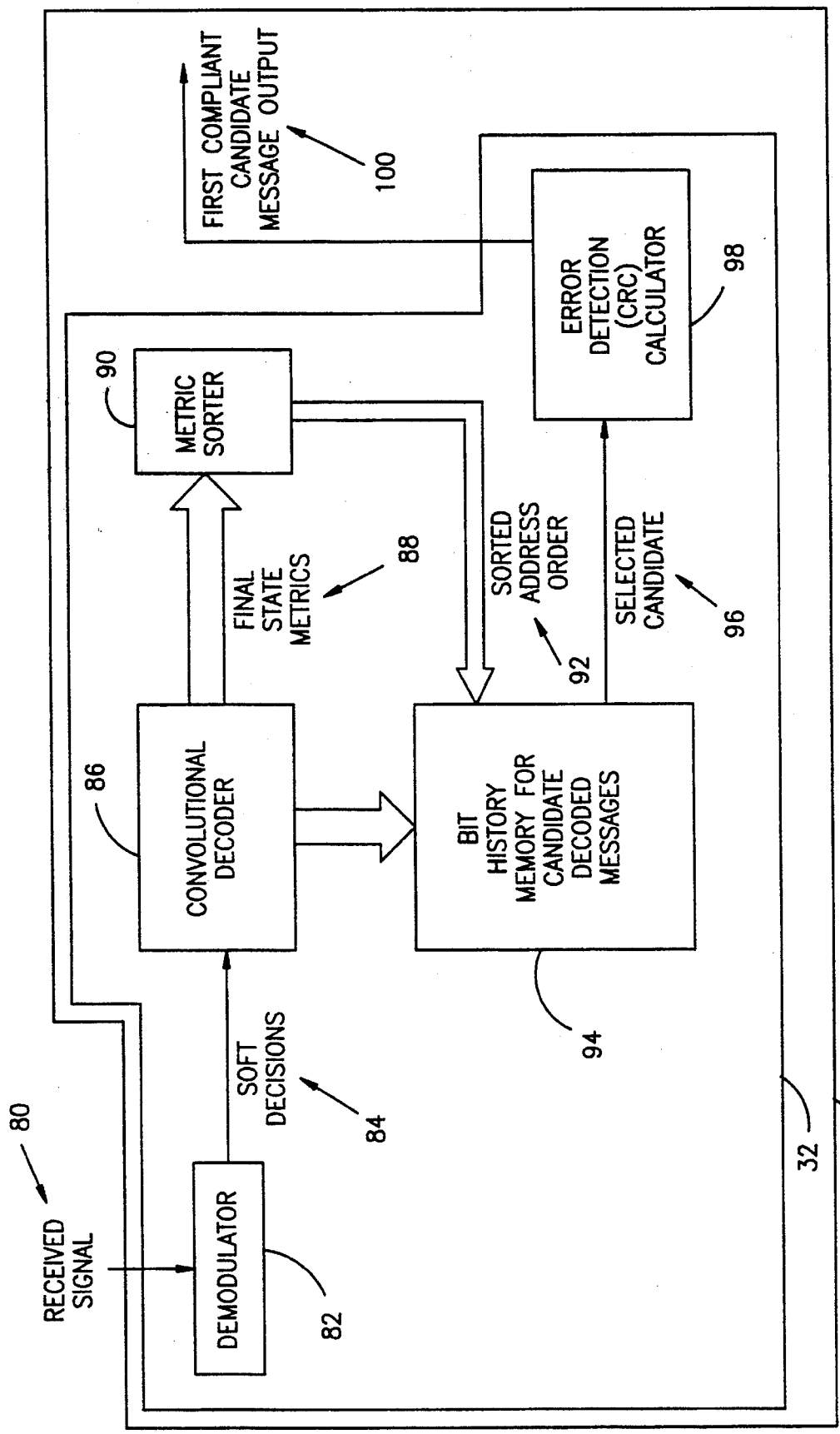
FIG. 10 shows a functional block diagram of a decoder according to another embodiment of the present invention.

Now referring also to FIGS. 9 and 10, a demodulator 82 in receiver 30 processes the signal 80 received over the communications transmission medium 78 (for example, a radio channel) to reconstitute estimates of the transmitted parity bits 74. These may be "hard" decisions 84 (binary 1's or 0's) or "soft" decisions 85, as shown in FIG. 10, which ideally are estimates of the logarithm of the probability that a parity bit is respectively a 1 or a 0. The hard 84 (or soft 85) parity bit information is then passed to a Viterbi SMLSE convolutional decoder 86 operating according to the preferred principles described above.

If tail-biting is used, then the $2^{(L-1)}$ states correspond to all possibilities for the as yet unknown first L-1 of the $N_1+N_2$ bits 66, and their path metrics are initialized to equal starting values, for example, zero. Decoding then proceeds as described. If tail-biting is not used, only the state 0, corresponding to the L-1 initial zeros fed into the encoder 22 shift register 24, can exist, and its path metric is initialized to zero. After one decoding iteration, two states are created corresponding to the first unknown data message bit being a 0 or a 1. After L-1 decoding iterations, all $2^{(L-1)}$ states are active and decoding then proceeds as normal.

After completion of Viterbi decoding, a number, $2^{(L-1)}$, of candidate $(N_1+N_2)$-bit sequences are available in memory 94, each with an associated path metric value. The final state path metrics 88 are passed to a path metric sorter 90 which orders the final state path metrics 88 in ascending order by value. The candidate $(N_1+N_2)$-bit sequences are then ordered using that sorted address order 92 and a candidate $(N_1+N_2)$-bit sequence is retrieved from memory 94 and passed to the CRC calculator 98. The CRC calculator 98 determines if the appended $N_2$ bit CRC word corresponds with the $N_1$ data message bits. The first candidate $(N_1+N_2)$-bit sequence found to have a valid CRC is then selected for its candidate $N_1$ data message bits to be output 100. If no valid CRC is found, and the CRC also has a limited error correction capability, the candidate $(N_1+N_2)$-bit sequences are checked again in sorted metric order for a single correctable error. The first candidate $(N_1+N_2)$-bit sequence found containing a single correctable error is then selected, and the error corrected. This procedure may be repeated up to the maximum allowed error correction capability of the CRC code.

The present invention, characterized in one aspect as the selection of the Nth best output of an error correction decoder according to the result of an error detection check procedure, can be applied also with forms of coding other than convolutional, such as block coding. For example, a small number of message data bits at a time can be converted to a redundant block code, and several such block codes transmitted to convey the whole message, including the CRC word. If upon performing the CRC check after decoding, some undetected errors remain, the quality of the block decoding can be examined and the least reliable block identified. The least reliable transmitted bit within the least reliable block can then be inverted and the block re-decoded, and the CRC rechecked. If this fails, the second least reliable bit or block can be modified and so on. Such applications of the present invention to the case of block coding can be devised in detail by someone ordinarily familiar with coding and decoding theory.

While particular embodiments of the present invention have been described and illustrated, it should be understood that the invention is not limited thereto since modifications may be made by persons of ordinary skill in the art to which the subject matter pertains. The present application contemplates any and all modifications that fall within the spirit and scope of the underlying invention disclosed and claimed herein.

What is claimed is:

1. A communications system providing for reduction of errors in transmission of communication traffic signals, comprising:

an error detection signal generator for generating an error detection checkword corresponding to a data message to be transmitted, an error correction encoder for encoding said data message and said error detection checkword, an error correction decoder for decoding an encoded data message and an encoded error detection checkword, said decoder including:

means for comparing encoded data message postulates with said encoded data message and for comparing encoded error detection checkword postulates with said encoded error detection checkword, and means for generating confidence factors based on said comparisons, and selection means for selecting a candidate decoded data message based on said confidence factors.

2. The system according to claim 1, wherein said data message and said error detection checkword are encoded using convolutional codes.

3. The system according to claim 1, wherein said decoder uses a sequential maximum likelihood sequence estimation technique to optimally decode said encoded data message and said encoded error detection checkword.

4. The system according to claim 1, wherein said decoder includes memory for storing postulate bit states, a history of selected bits for each of said postulate bit states, and a confidence factor for each of said postulate bit states.

5. The system according to claim 1, further comprising:
   a transmitter having a convolutional encoder including:
      an L-bit shift register for storing L bits of data message information and error detection checkword information;
      a logic circuit for logically combining particular ones of said L bits in order to generate parity bits; and
      means for transmitting said parity bits.

6. The system according to claim 1, wherein said encoded data message and said encoded error detection checkword are parity bits.

7. The system according to claim 1, wherein said error correction encoder is initialized and terminated by encoding bits unknown to said decoder.

8. The system according to claim 1, wherein said error correction encoder is initialized and terminated by encoding bits known to said decoder.

9. The system according to claim 1, wherein said data message is $N_1$ message bits and said error detection checkword is $N_2$ error detection bits.

10. The system according to claim 9, wherein said $N_2$ error detection bits are the remainder on polynomial division of said $N_1$ message bits by a cyclic redundancy check polynomial.

11. A method of communicating data adapted for reducing the incidence of data bit errors arising from transmission, comprising the steps of:
   assembling a number of data bits into a message to be transmitted;
   calculating a number of first error detection bits as a function of said message data bits;
   appending said error detection bits to said message;
   encoding said message and said appended error detection bits in an error correction encoder;
   producing a larger number of bits from said encoder for transmission;
   modulating said larger number of bits;
   transmitting said modulated bits over a communications medium;
   receiving estimates of said transmitted bits;
   demodulating said received estimates;
   decoding said demodulated estimates in an error correction decoder;
   generating a plurality of candidate bit sequences corresponding to the N most likely candidate message data and candidate first error detection bit sequences to have been transmitted;
   calculating a number of second error detection bits as a function of decoded message data bits for each of said candidate bit sequences;
   for each candidate bit sequence, comparing its calculated second error detection bits with its candidate first error detection bits to form an error detection syndrome, an error detection syndrome having a value of zero indicating that a candidate message data is error-free; and
   selecting a candidate message having a highest likelihood and an error detection syndrome having a value of zero, or if no zero value syndrome is found, selecting a candidate message having a highest likelihood and an acceptable non-zero error detection syndrome.

12. A method of communicating data according to claim 11 wherein said error detection bits are the remainder on polynomial division of said message data bits by a cyclic redundancy check polynomial.

13. A method of communicating data according to claim 11 wherein said error correction encoding is a convolutional encoding.

14. A method of communicating data according to claim 11 wherein said error correction encoding is a convolutional encoding using tail-biting, further comprising the steps of:
   initializing said encoder by feeding in data bits unknown to said receiving decoder prior to said transmission; and
   terminating said encoder by feeding in said data bits again.

15. A method of communicating data according to claim 11 wherein said error correction encoding is a convolutional encoding, further comprising the steps of:
   initializing said encoder by feeding in a bit pattern known to said receiving decoder prior to said transmission; and
   terminating said encoder by feeding in said bit pattern again.

16. A method of communicating data according to claim 11 wherein said error correction decoding uses a sequential maximum likelihood sequence estimation Viterbi algorithm.

17. A method of communicating data according to claim 11, further comprising the step of:
   sorting final states of said decoder in ascending order of respective path metrics of said final states following the decoding of a complete input signal sequence for determining the order of said error detection bit comparisons.

18. A method of communicating data adapted for reducing the incidence of data bit errors arising from transmission, comprising the steps of: assembling a number of data bits into a message to be transmitted; calculating a number of first error detection bits as a function of said message data bits; appending said error detection bits to said message; encoding said message and said appended error detection bits in an error correction encoder; producing a larger number of bits from said encoder for transmission; modulating said larger number of bits; transmitting said modulated bits over a communications medium; receiving estimates of said transmitted bits; demodulating said received estimates; decoding said demodulated estimates in an error correction decoder; generating a plurality of candidate bit sequences corresponding to the N most likely candidate message data and candidate first error detection bit sequences to have been transmitted; calculating a number of second error detection bits as a function of message data bits for each of said candidate bit sequences;

for each candidate bit sequence, comparing its calculated second error detection bits with its candidate first error detection bits to produce a syndrome indicative of the number of errors;

selecting a first candidate message from the candidate bit sequence having a highest likelihood and a syndrome indicative of no errors, or when no such candidate exists, selecting a second candidate message from the candidate bit sequence having the highest likelihood and a syndrome indicative of a correctable number of errors; and correcting said bit error in said second selected candidate message.

19. A method of communicating data according to claim 18 wherein said error detection bits are the remainder on polynomial division of said message data bits by a cyclic redundancy check polynomial.

20. A method of communicating data according to claim 18 wherein said error correction encoding is a convolutional encoding.

21. A method of communicating data according to claim 18 wherein said error correction encoding is a convolutional encoding using tail-biting, further comprising the steps of:

initializing said encoder by feeding in data bits unknown to said receiving decoder prior to said transmission; and terminating said encoder by feeding in said data bits again.

22. A method of communicating data according to claim 18 wherein said error correction encoding is a convolutional encoding, further comprising the steps of:

initializing said encoder by feeding in a bit pattern known to said receiving decoder prior to said transmission; and terminating said encoder by feeding in said bit pattern again.

23. A method of communicating data according to claim 18 wherein said error correction decoding uses a sequential maximum likelihood sequence estimation Viterbi algorithm.

24. A method of communicating data according to claim 18, further comprising the step of:

sorting final states of said decoder in ascending order of respective path metrics of said final states following the decoding of a complete input signal sequence for determining the order of said error detection bit comparisons.

25. A decoder apparatus comprising:

logic circuitry for receiving a transmitted data message with an appended error check code;

logic circuitry for generating a plurality of candidate data messages and an associated plurality of appended candidate error check codes, each of said plurality of candidate data messages having associated therewith a confidence measure indicative of a likelihood that said candidate data message matches said transmitted data message;

logic circuitry for identifying, using said candidate error check codes, an error-free candidate data message having a highest confidence measure, and in absence thereof, for correcting a least-erroneous data message having a highest confidence measure;

output circuitry for outputting said identified error-free candidate data message having a highest confidence measure, or in absence thereof, said corrected data message.

* * * * *